US012757594B2

(12) United States Patent
Kim et al.

(10) Patent No.: US 12,757,594 B2
(45) Date of Patent: Oct. 6, 2026

(54) DUAL-SIDE ORGANIC LIGHT EMITTING DISPLAY DEVICE

(71) Applicant: LG Display Co., Ltd., Seoul (KR)

(72) Inventors: Hee-Jin Kim, Paju-si (KR); Hak-Min Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 433 days.

(21) Appl. No.: 18/508,985

(22) Filed: Nov. 14, 2023

(65) Prior Publication Data

US 2024/0224661 A1 Jul. 4, 2024

(30) Foreign Application Priority Data

Dec. 29, 2022 (KR) ........................ 10-2022-0189153

(51) Int. Cl.
*H10K 59/131* (2023.01)
*G09G 3/3233* (2016.01)
*H10K 59/122* (2023.01)

(52) U.S. Cl.
CPC ......... *H10K 59/131* (2023.02); *G09G 3/3233* (2013.01); *H10K 59/122* (2023.02);
(Continued)

(58) Field of Classification Search
CPC .. H10K 59/122; H10K 59/131; H10K 59/121; H10K 59/128; H10K 59/352;
(Continued)

(56) References Cited

U.S. PATENT DOCUMENTS 6,998,772 B2 2/2006 Terumoto
7,250,728 B2 7/2007 Chen et al.
(Continued)

FOREIGN PATENT DOCUMENTS

CN 109997230 A 7/2019
JP 2004014316 A 1/2004
(Continued)

OTHER PUBLICATIONS

Japan Patent Office, Office Action, Japanese Patent Application No. 2023-208664, Jan. 7, 2025, 11 pages.
(Continued)

*Primary Examiner* — Mouloucoulaye Inoussa
(74) *Attorney, Agent, or Firm* — Fenwick & West LLP

(57) ABSTRACT

A dual-side organic light emitting display device comprising a transparent substrate including a pixel region, the pixel region including first and second regions; first and second driving elements in the first region and over the transparent substrate; a first organic light emitting diode in the second region and over the first and second driving elements, the first organic light emitting diode including a first electrode connected to the first driving element, a second electrode disposed over the first electrode and a first organic light emitting layer between the first and second electrodes; and a second organic light emitting diode in the first and second regions and on the first organic light emitting diode, the second organic light emitting diode including a third electrode disposed over the second electrode and connected to the second driving element and a second organic light emitting layer between the second and third electrodes.

24 Claims, 6 Drawing Sheets

(52) U.S. Cl.
CPC ............... *G09G 2300/0426* (2013.01); *G09G 2300/0852* (2013.01); *G09G 2310/0262* (2013.01)

(58) Field of Classification Search
CPC ...... H10K 50/13; H10K 59/32; H10K 59/353; H10K 59/876; H10K 59/80518; H10K 59/8731; H10K 59/123; H10K 59/124; H10K 59/12; H10K 59/1213; H10K 59/1201; H10K 59/18; H10K 59/19; H10K 59/8792; H10K 59/126; H10K 59/8051; H10K 59/8052; H10K 2102/3031; H10K 2102/103; H10K 2102/3023; H10K 2102/3026; G09G 3/3233; G09G 2300/0426; G09G 2300/0852; G09G 2310/0262
See application file for complete search history.

(56) References Cited

U.S. PATENT DOCUMENTS

| | | | | |
|---|---|---|---|---|
| 8,680,693 | B2 | 3/2014 | Kang et al. | |
| 9,111,890 | B2 | 8/2015 | Chung et al. | |
| 9,634,075 | B2 | 4/2017 | Chung et al. | |
| 11,183,111 | B2 | 11/2021 | Huang | |
| 2003/0227254 | A1 | 12/2003 | Terumoto | |
| 2004/0263056 | A1* | 12/2004 | Seo | H10K 59/176 313/506 |
| 2005/0062408 | A1 | 3/2005 | Yoo et al. | |
| 2005/0237279 | A1* | 10/2005 | Chen | H10K 59/128 345/76 |
| 2007/0164277 | A1* | 7/2007 | Sung | H10K 59/128 257/40 |
| 2009/0009101 | A1 | 1/2009 | Kang et al. | |
| 2009/0051285 | A1 | 2/2009 | Kajiyama et al. | |
| 2013/0187131 | A1 | 7/2013 | Chung et al. | |
| 2014/0167626 | A1* | 6/2014 | Kim | H10K 59/128 315/161 |
| 2015/0048335 | A1* | 2/2015 | Chung | H10K 59/121 438/34 |
| 2015/0076456 | A1* | 3/2015 | Choi | H10K 59/128 438/34 |
| 2015/0357382 | A1 | 12/2015 | Chung et al. | |
| 2016/0260791 | A1* | 9/2016 | Fleissner | H10K 59/352 |
| 2017/0025488 | A1* | 1/2017 | Li | H10K 59/126 |
| 2019/0103060 | A1* | 4/2019 | Kang | H10D 86/60 |
| 2019/0221629 | A1* | 7/2019 | Tian | H10K 59/123 |
| 2020/0211455 | A1* | 7/2020 | Yang | H10K 59/122 |
| 2021/0027705 | A1* | 1/2021 | Huang | H10F 39/80 |
| 2022/0328582 | A1* | 10/2022 | Lee | H10K 59/353 |

FOREIGN PATENT DOCUMENTS

| | | | |
|---|---|---|---|
| JP | 2005004188 | A | 1/2005 |
| JP | 2005038833 | A | 2/2005 |
| JP | 2005038838 | A | 2/2005 |
| JP | 2005100928 | A | 4/2005 |
| JP | 2005310782 | A | 11/2005 |
| JP | 2009054328 | A | 3/2009 |
| KR | 10-2007-0076521 | A | 7/2007 |
| KR | 10-2017-0087095 | A | 7/2017 |
| KR | 10-2022-0085197 | A | 6/2022 |
| TW | 201332100 | A | 8/2013 |
| WO | WO-2019205547 | A1 | 10/2019 |

OTHER PUBLICATIONS

Japan Patent Office, Office Action, Japanese Patent Application No. 2023-208664, May 13, 2025, 10 pages.

Taiwan Intellectual Property Office, Office Action, Taiwanese Patent Application No. 112139819, Jun. 25, 2024, 14 pages.

* cited by examiner

DUAL-SIDE ORGANIC LIGHT EMITTING DISPLAY DEVICE

CROSS-REFERENCE TO RELATED APPLICATIONS

The present application claims the benefit of Republic of Korea Patent Application No. 10-2022-0189153 filed in the Republic of Korea on Dec. 29, 2022, which is hereby incorporated by reference in its entirety.

FIELD OF TECHNOLOGY

The present disclosure relates to an organic light emitting display device, and more specifically, to an organic light emitting display device having high aperture ratio and emitting efficiency and improved lifespan.

BACKGROUND

Recently, requirement for flat panel display devices having small occupied area is increased. Among the flat panel display devices, a technology of an organic light emitting display device, which includes an organic light emitting diode (OLED), is rapidly developed.

The OLED includes a cathode as an electron injection electrode, an anode as a hole injection electrode and an emitting material layer therebetween. When electrons from the cathode and holes from the anode are injected into the emitting material layer, the electrons and holes are combined to generate an exciton, and the exciton is transformed from an excited state to a ground state. As a result, the light is emitted from the OLED. The OLED can be formed on a flexible transparent substrate, e.g., a plastic substrate, and can be driven by low voltage. In addition, the OLED has low power consumption and high color sense.

The organic light emitting display device includes an organic light emitting diode (OLED), and the OLED includes a first electrode, a second electrode and an organic light emitting layer therebetween.

Recently, a dual-side display device for displaying images at both sides has been introduced.

However, since the first electrode or the second electrode of the OLED is formed of an opaque material, there is a limitation in the related art organic light emitting display device in use as the dual-side display device.

SUMMARY

The present disclosure is directed to an organic light emitting display device that substantially obviates one or more of the problems associated with the limitations and disadvantages of the related conventional art.

An object of the present disclosure is to provide an organic light emitting display device having high aperture ratio and emitting efficiency and improved lifespan.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, an embodiment of the present disclosure is a dual-side organic light emitting display device comprising a first transparent substrate including a pixel region, the pixel region including a first region and a second region; a first driving element and a second driving element positioned in the first region and over the first transparent substrate; a first organic light emitting diode positioned in the second region and over the first and second driving elements, the first organic light emitting diode including a first electrode connected to the first driving element, a second electrode disposed over the first electrode and a first organic light emitting layer between the first and second electrodes; and a second organic light emitting diode positioned in the first and second regions and on the first organic light emitting diode, the second organic light emitting diode including a third electrode disposed over the second electrode and connected to the second driving element and a second organic light emitting layer between the second and third electrodes, wherein a first light from the first organic light emitting diode is emitted toward a first direction through the first electrode, and a second light from the second organic light emitting diode is emitted toward a second direction through the third electrode, and wherein the second direction is opposite to the first direction.

Another embodiment of the present disclosure includes a dual-side organic light emitting display device, including a substrate having a first region and a second region, at least one driving element in the first region, an insulating layer on the at least one driving element, and an organic light emitting diode (OLED) stack. The OLED stack includes a first electrode on the insulating layer, a first organic light emitting layer on the first electrode in the second region, a second electrode on the first organic light emitting layer, a second organic light emitting layer on the second electrode in at least the first region and the second region, and a third electrode on the second organic light emitting layer. The at least one driving element is configured to drive the OLED stack. In particular, the at least one driving element is configured to drive the first organic light emitting layer to emit first light in a first direction, and drive the second organic light emitting layer to emit second light in a second direction opposite to the first direction.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure.

DETAILED DESCRIPTION

Figure 1:
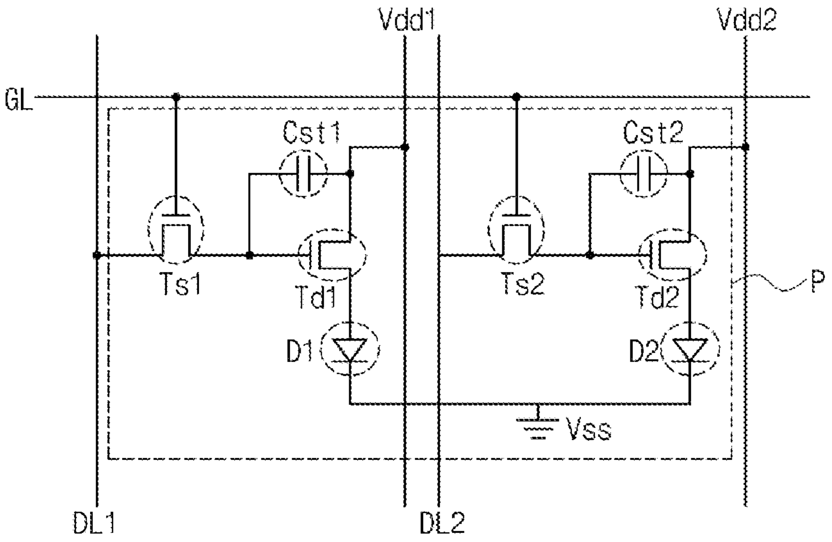
FIG. 1 is a schematic circuit diagram illustrating a dual-side organic light emitting display device according to some embodiments of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the disclosure to the skilled in the art of the present disclosure.

The shapes, sizes, proportions, angles, numbers, and the like disclosed in the drawings for explaining the aspects of the present disclosure are illustrative, and the present disclosure is not limited to the illustrated matters. The same reference numerals refer to the same elements throughout the specification. In addition, in describing the present disclosure, if it is determined that a detailed description of the related known technology unnecessarily obscure the subject matter of the present disclosure, the detailed description thereof can be omitted. When 'including', 'having', 'consisting', and the like are used in this specification, other parts may be added unless 'only' is used. When a component is expressed in the singular, cases including the plural are included unless specific statement is described.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Reference will now be made in detail to some of the examples and preferred embodiments, which are illustrated in the accompanying drawings.

FIG. 1 is a schematic circuit diagram illustrating a dual-side organic light emitting display device of the present disclosure.

As illustrated in FIG. 1, in a dual-side organic light emitting display device, a gate line GL, a first data line DL1, a second data line DL2, a low potential voltage line Vss and a first high potential voltage line Vdd1, a second high potential voltage line Vdd2, a first switching element Ts1, a second switching element Ts2, a first driving element Td1, a second driving element Td2, a first OLED D1 and a second OLED D2 are formed.

In addition, in the dual-side organic light emitting display device, a first storage capacitor Cst1 and a second storage capacitor Cst2 may be further formed.

A pixel region is defined by the gate line GL and the first data line DL1. Namely, the gate line GL and the first data line DL1 cross each other to define the pixel region. The pixel region may include a red pixel region, a green pixel region and a blue pixel region.

The first switching element Ts1 is connected to the gate line GL and the first data line DL1, and the first driving element Td1 and the first storage capacitor Cst1 are connected to the first switching element Ts1 and the first high potential voltage line Vdd1. The first OLED D1 is connected to the first driving element Td1 and the low potential voltage line Vss.

The second switching element Ts2 is connected to the gate line GL and the second data line DL2, and the second driving element Td2 and the second storage capacitor Cst2 are connected to the second switching element Ts2 and the second high potential voltage line Vdd2. The second OLED D2 is connected to the second driving element Td2 and the low potential voltage line Vss.

In the dual-side organic light emitting display device, when the first switching element Ts1 is turned on by the gate signal applied through the gate line GL, the first data signal applied through the first data line DL1 is applied to a gate electrode of the first driving element Td1 and one electrode of the first storage capacitor Cst1 through the first switching element Ts1.

The first driving element Td1 is turned on by the first data signal applied into the gate electrode so that a current proportional to the first data signal is supplied from the first high potential voltage line Vdd1 to the first OLED D1 through the first driving element Td1. The first OLED D1 emits light having a luminance proportional to the current flowing through the first driving element Td1.

In this case, the first storage capacitor Cst1 is charged with a voltage proportional to the first data signal so that the voltage of the gate electrode in the first driving element Td1 is kept constant during one frame.

In addition, when the second switching element Ts2 is turned on by the gate signal applied through the gate line GL, the second data signal applied through the second data line DL2 is applied to a gate electrode of the second driving element Td2 and one electrode of the second storage capacitor Cst2 through the second switching element Ts2.

The second driving element Td2 is turned on by the second data signal applied into the gate electrode so that a current proportional to the second data signal is supplied from the second high potential voltage line Vdd2 to the second OLED D2 through the second driving element Td2. The second OLED D2 emits light having a luminance proportional to the current flowing through the second driving element Td2.

In this case, the second storage capacitor Cst2 is charged with a voltage proportional to the first data signal so that the voltage of the gate electrode in the second driving element Td2 is kept constant during one frame.

Therefore, the dual-side organic light emitting display device can display desired images.

Figure 2:
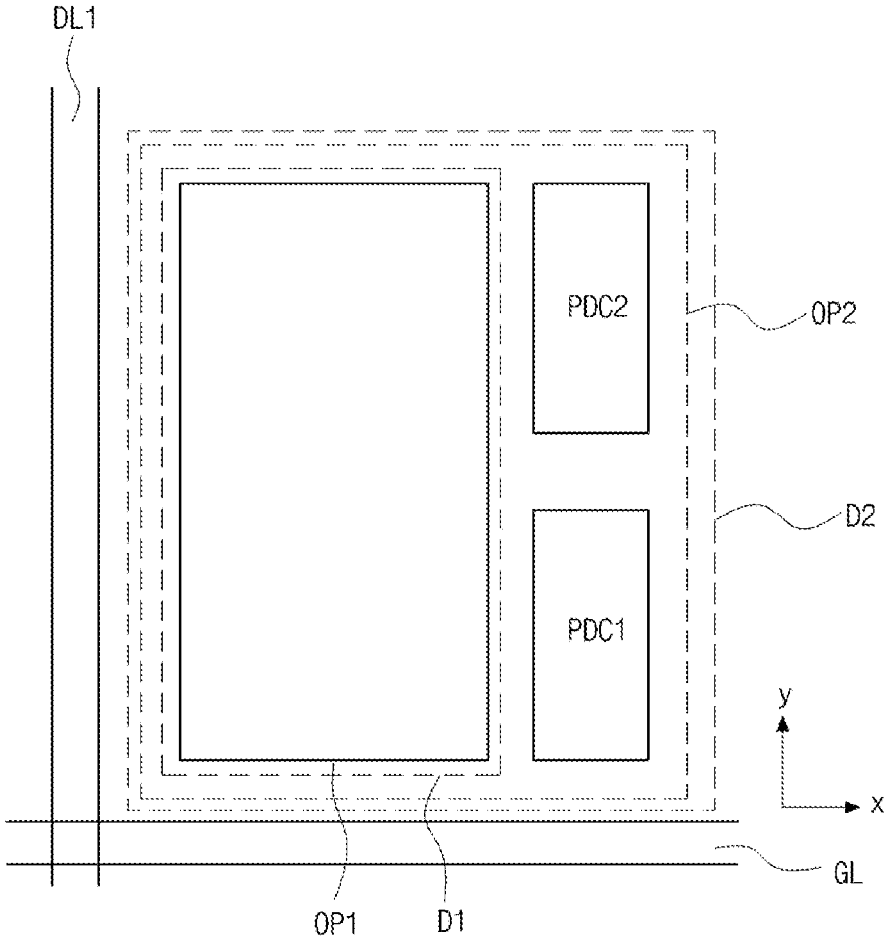
FIG. 2 is a schematic plane view showing a pixel region of a dual-side organic light emitting display device according to a first embodiment of the present disclosure.

FIG. 2 is a schematic plane view showing a pixel region of a dual-side organic light emitting display device according to a first embodiment of the present disclosure.

As shown in FIG. 2, in a dual-side organic light emitting display device, the gate line GL extends along a first direction x, and the first data line DL1 extends along a second direction y crossing the first direction x. For example, the first direction x and the second direction y may be perpendicular to each other.

In the dual-side organic light emitting display device, a first opening op1 corresponding to a first electrode, e.g., a lower electrode or a first anode, of the first OLED D1 and a second opening op2 corresponding to a second electrode, e.g., a middle electrode or a cathode, which is shared by the first OLED D1 and the second OLED D2, are formed. The first opening op1 may be an emitting area of the first OLED D1, and the second opening op2 may be an emitting area of the second OLED D2.

The second opening op2 completely overlaps the first opening op1 and has an area greater than the first opening op1. Namely, the first OLED D1 has a first aperture ratio, and the second OLED D2 has a second aperture ratio greater than the first aperture ratio.

In addition, the dual-side organic light emitting display device may further include a first pixel driving circuit part PDC1 for driving the first OLED D1 and a second pixel driving circuit part PDC2 for driving the second OLED D2. The first and second pixel driving circuit parts PDC1 and PDC2 are positioned at the first direction x from the first opening op1. Namely, the first opening op1 is positioned between the first opening op1 and the first and second pixel driving circuit parts PDC1 and PDC2.

For example, each of the first and second pixel driving circuit parts PDC1 and PDC2 may include at least one of the switching element, the driving element and the storage capacitor.

Namely, the first and second pixel driving circuit parts PDC1 and PDC2 do not overlap the first opening op1 and overlap the second opening op2. In other words, the first OLED D1 does not overlap the first and second pixel driving circuit parts PDC1 and PDC2, and the second OLED D2 overlaps the first and second pixel driving circuit parts PDC1 and PDC2.

A first region and a second region are defined in the pixel region P. The first and second pixel driving circuit parts PDC1 and PDC2 are disposed in the first region, and the first OLED D1 is disposed in the second region. The first pixel driving circuit part PDC1 including the first driving element Td1 and the second pixel driving circuit part PDC2 including the second driving element Td2 is positioned at the first direction x from the first OLED D1. The second OLED D2 is positioned in the first and second regions.

Accordingly, an aperture ratio of the second OLED D2 is improved.

Figure 3:
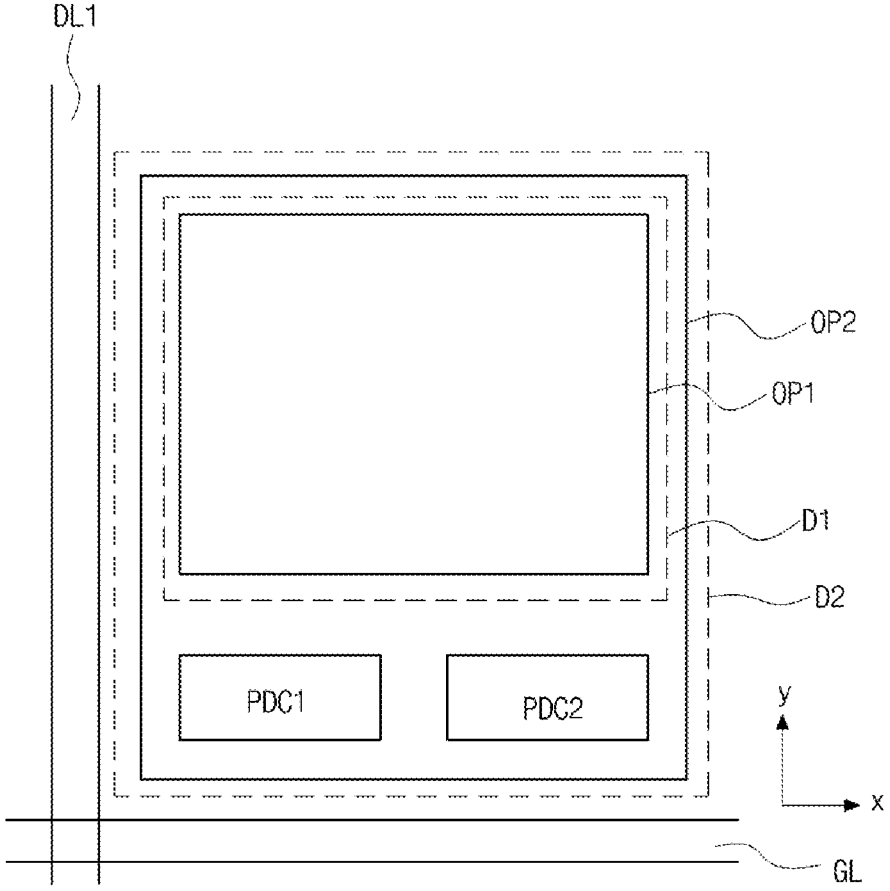
FIG. 3 is a schematic plane view showing a pixel region of a dual-side organic light emitting display device according to a second embodiment of the present disclosure.

FIG. 3 is a schematic plane view showing a pixel region of a dual-side organic light emitting display device according to a second embodiment of the present disclosure.

As shown in FIG. 3, in a dual-side organic light emitting display device, the gate line GL extends along a first direction x, and the first data line DL1 extends along a second direction y crossing the first direction x. For example, the first direction x and the second direction y may be perpendicular to each other.

In the dual-side organic light emitting display device, a first opening op1 corresponding to a first electrode, e.g., a lower electrode or a first anode, of the first OLED D1 and a second opening op2 corresponding to a second electrode, e.g., a middle electrode or a cathode, which is shared by the first OLED D1 and the second OLED D2, are formed. The first opening op1 may be an emitting area of the first OLED D1, and the second opening op2 may be an emitting area of the second OLED D2.

The second opening op2 completely overlaps the first opening op1 and has an area greater than the first opening op1. Namely, the first OLED D1 has a first aperture ratio, and the second OLED D2 has a second aperture ratio greater than the first aperture ratio.

In addition, the dual-side organic light emitting display device may further include a first pixel driving circuit part PDC1 for driving the first OLED D1 and a second pixel driving circuit part PDC2 for driving the second OLED D2. The first and second pixel driving circuit parts PDC1 and PDC2 are positioned at the second direction y from the first opening op1. Namely, the first and second pixel driving circuit parts PDC1 and PDC2 are positioned between the first opening op1 and the gate line GL.

Namely, the first and second pixel driving circuit parts PDC1 and PDC2 do not overlap the first opening op1 and overlap the second opening op2. In other words, the first OLED D1 does not overlap the first and second pixel driving circuit parts PDC1 and PDC2, and the second OLED D2 overlaps the first and second pixel driving circuit parts PDC1 and PDC2.

A first region and a second region are defined in the pixel region P. The first and second pixel driving circuit parts PDC1 and PDC2 are disposed in the first region, and the first OLED D1 is disposed in the second region. The first pixel driving circuit part PDC1 including the first driving element Td1 and the second pixel driving circuit part PDC2 including the second driving element Td2 is positioned at the second direction y from the first OLED D1. The second OLED D2 is positioned in the first and second regions.

Accordingly, an aperture ratio of the second OLED D2 is improved.

Figure 4:
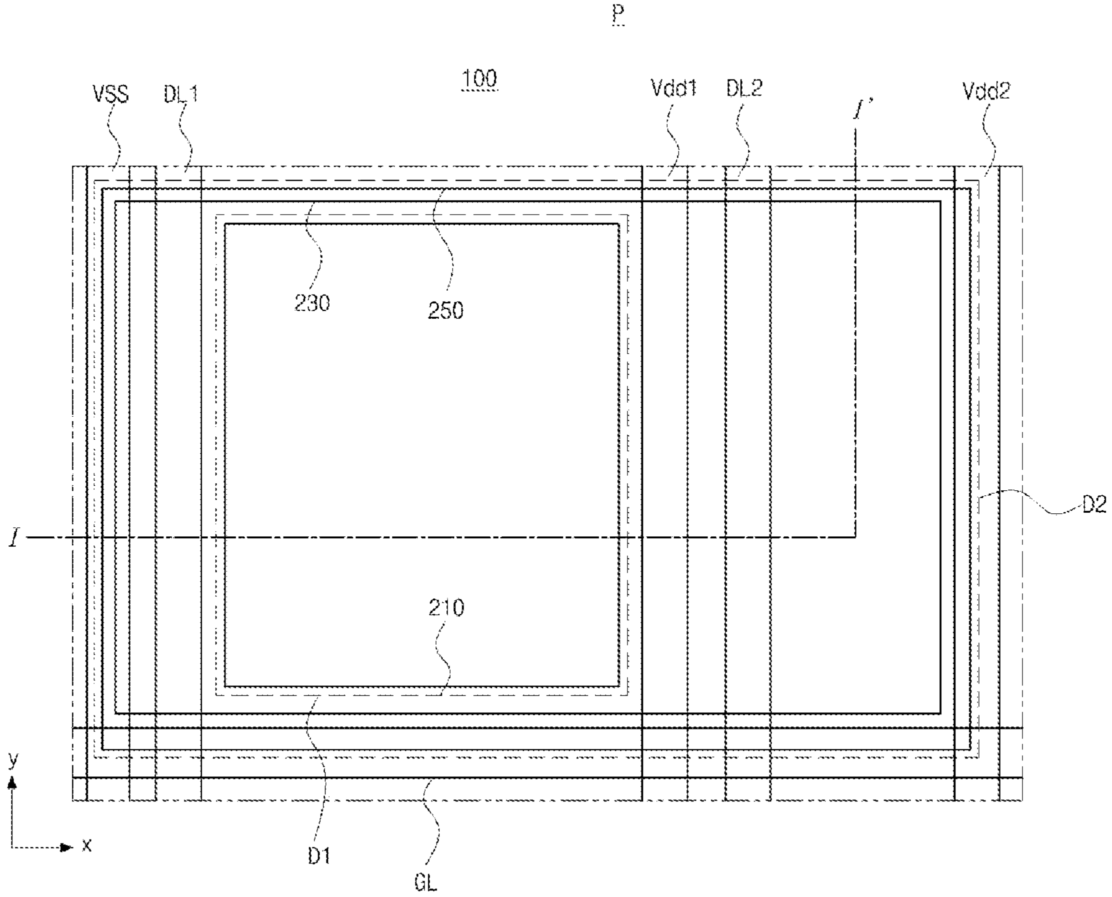
FIG. 4 is a schematic plane view showing a structure of a pixel region of a dual-side organic light emitting display device according to the first embodiment of the present disclosure.

FIG. 4 is a schematic plane view showing a structure of a pixel region of a dual-side organic light emitting display device according to the first embodiment of the present disclosure.

As shown in FIG. 4, the dual-side organic light emitting display device 100 includes the gate line GL, the low potential voltage line Vss, the first high potential voltage line Vdd1, the second high potential voltage line Vdd2, the first data line DL1, the second data line DL2, the first driving element Td1 (of FIG. 1), the second driving element Td2 (of FIG. 1), the first OLED D1 and the second OLED D2.

The gate line GL extends along the first direction x, and each of the first data line DL1, the second data line DL2, the low potential voltage line Vss, the first high potential voltage line Vdd1 and the second high potential voltage line Vdd2 extends along the second direction y. For example, the second direction y may be perpendicular to the first direction x.

The first driving element Td1 is connected to the first high potential voltage line Vdd1, and the second driving element Td2 is connected to the second high potential voltage line Vdd2.

The first OLED D1 is connected to the first driving element Td1 and the low potential voltage line Vss, and the second OLED D2 is connected to the second driving element Td and the low potential voltage line Vss.

In addition, the dual-side organic light emitting display device 100 may further include the first switching element Ts1 (of FIG. 1), which is connected to the gate line GL, the first data line DL1 and the first driving element Td1, and the second switching element Ts2 (of FIG. 1), which is connected to the gate line GL, the second data line DL2 and the second driving element Td2.

The low potential voltage line Vss, the first data line DL1, the first high potential voltage line Vdd1, the second data line DL2 and the second high potential voltage line Vdd2 may be sequentially arranged along the first direction x to be spaced apart from each other.

The low potential voltage line Vss or the first data line DL1 and the second high potential voltage line Vdd2 cross with the gate line GL to define the pixel region P, and the first and second switching elements Ts1 and Ts2, the first and second driving elements Td1 and Td2 and the first and second OLEDs D1 and D2 are disposed in each pixel region P.

The first OLED D1 includes a first electrode 210 as an anode, a first organic light emitting layer and a second electrode 230 as a cathode, and the second OLED D2 includes a second electrode 230 as a cathode, a second organic light emitting layer and a third electrode 250 as an anode. Namely, the second OLED D2 shares the second electrode 230 of the first OLED D1 and is disposed on the first OLED D1.

The first and second OLEDs D1 and D2 share the second electrode 230 as the cathode. The first OLED D1 is driven by the first driving element Td1, and the second OLED D2 is driven by the second driving element Td2. Namely, the first and second OLEDs D1 and D2 are independently driven.

The first OLED D1 is positioned in a space between the first data line DL1 and the first high potential voltage line Vdd1, and the second OLED D2 has a plan area greater than the first OLED D1. For example, one end of the second OLED D2 may overlap the low potential voltage line Vss, and the other end of the second OLED D2 may overlap the second high potential voltage line Vdd2.

Namely, the first OLED D1 may not overlap the gate line GL, the first and second data lines DL1 and DL2, the low potential voltage line Vss and the first and second high potential voltage lines Vdd1 and Vdd2, and the second OLED D2 may overlap the gate line GL, the first and second data lines DL1 and DL2, the low potential voltage line Vss and the first and second high potential voltage lines Vdd1 and Vdd2.

The first OLED D1 emits light along a first normal line direction with respect to the first and second directions x and y, and the second OLED D2 emits light along a second normal line direction opposite to the first normal line direction.

Accordingly, the dual-side organic light emitting display device 100 of the present disclosure can provide a dual-side image display. Namely, in the dual-side organic light emitting display device 100 of the present disclosure, a first image can be displayed at a side in the first normal line direction, and a second image can be displayed at a side in the second normal line direction.

Figure 5:
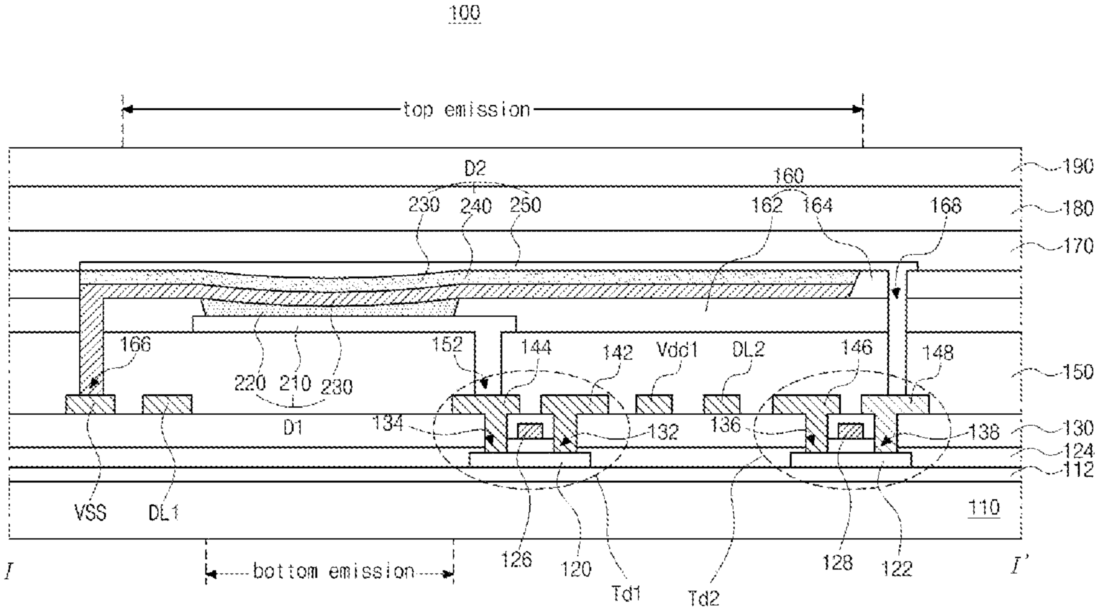
FIG. 5 is a cross-sectional view taken along the line I-I' in FIG. 4 according to the first embodiment of the present disclosure.

FIG. 5 is a cross-sectional view taken along the line I-I' in FIG. 4. As illustrated in FIG. 5, the first electrode 210, the first organic light emitting layer 220 on the first electrode, the second electrode 230 on the first organic light emit layer 220, the second organic light emitting layer 240 on the second electrode 230, and the third electrode 250 on the second organic light emitting layer 240 form a stack (also referred to as an "OLED stack"). In some embodiments, the dual-side organic light emitting display device includes a substrate (e.g., the first transparent substrate 110, or the second transparent substrate 190), an OLED stack, and at least one driving element (e.g., driving element Td1 or Td2).

In some embodiments, the first electrode 210 is on an insulating layer 130. The second organic light emitting layer 220 is in the second region (e.g., left side). The second organic light emitting layer 240 is in the first region and the second region. The at least one driving element is configured to drive the OLED stack. In particular, the at least one driving element is configured to drive the first organic light emitting layer 220 to emit first light in a first direction (e.g., toward the first transparent substrate 110) and drive the second organic light emitting layer to emit second light in a second direction (e.g., toward the second transparent substrate 190) opposite to the first direction. In some embodiments, the at least one driving element (e.g., first or second driving element Td1, Td2) is disposed below the second organic light emitting layer.

As shown in FIG. 5, the first and second driving elements Td1 and Td2 and the first and second OLEDs D1 and D2 are formed on a first transparent substrate 110 including a pixel region.

In addition, a protection layer 170 covering the second OLED D2, a seal layer 180 on the protection layer 170 and a second transparent substrate 190 may be disposed on the second OLED D2.

Each of the first and second transparent substrates 110 and 190 may be a glass substrate or a flexible substrate. For example, the flexible substrate may be one of a polyimide (PI) substrate, a polyethersulfone (PES) substrate, a polyethylenenaphthalate (PEN) substrate, a polyethylene Terephthalate (PET) substrate and a polycarbonate (PC) substrate.

A buffer layer 112 is formed on the first transparent substrate 110, and the first and second driving elements Td1 and Td2 are formed on the buffer layer 112. For example, the buffer layer 112 may be formed of an inorganic insulating material, e.g., silicon oxide or silicon nitride. The buffer layer 112 may be omitted. In this case, the first and second driving elements Td1 and Td2 can be formed on the first transparent substrate 110.

A first semiconductor layer 120 and a second semiconductor layer 122 are formed on the buffer layer 112. Each of the first and second semiconductor layers 120 and 122 may include an oxide semiconductor material. When the first and second semiconductor layers 120 and 122 include the oxide semiconductor material, a light-shielding pattern (not shown) may be formed under the first and second semiconductor layers 120 and 122. The light to the first and second semiconductor layers 120 and 122 can be shielded or blocked by the light-shielding pattern such that thermal degradation of the first and second semiconductor layers 120 and 122 can be prevented or at least reduced.

Alternatively, each of the first and second semiconductor layers 120 and 122 may include polycrystalline silicon. In this case, impurities may be doped into both sides of each of the first and second semiconductor layers 120 and 122.

A gate insulating layer 124 is formed on the first and second semiconductor layers 120 and 122 and over an entire surface of the first transparent substrate 110. The gate insulating layer 124 may be formed of an inorganic insulating material such as silicon oxide (SiOx) or silicon nitride (SiNx).

A first gate electrode 126 and a second gate electrode 128, each of which is formed of a conductive material, e.g., metal, is formed on the gate insulating layer 124. The first and second gate electrodes 126 and 128 correspond to a center of the first and second semiconductor layers 120 and 122, respectively.

In addition, the gate line GL is formed on the gate insulating layer 124.

In FIG. 5, the gate insulating layer 124 is formed on an entire surface of the first transparent substrate 110. Alternatively, the gate insulating layer 124 may be patterned to have the same shape as each of the first and second gate electrode 126 and 128.

An interlayer insulating layer 130, which is formed of an insulating material, is formed on the first and second gate electrode 126 and 128 and over an entire surface of the first transparent substrate 110. The interlayer insulating layer 130 may be formed of an inorganic insulating material, e.g., silicon oxide or silicon nitride, or an organic insulating material, e.g., benzocyclobutene or photo-acryl.

The interlayer insulating layer 130 includes first and second contact holes 132 and 134 exposing both sides of the first semiconductor layer 120 and third and fourth contact holes 136 and 138 exposing both sides of the second semiconductor layer 122. The first and second contact holes 132 and 134 are positioned at both sides of the first gate electrode 126 to be spaced apart from the first gate electrode 126, and the third and fourth contact holes 136 and 138 are positioned at both sides of the second gate electrode 128 to be spaced apart from the second gate electrode 128.

In FIG. 5, the first to fourth contact holes 132, 134, 136 and 138 are formed through the interlayer insulating layer 130 and the gate insulating layer 124. Alternatively, when the gate insulating layer 124 is patterned to have the same shape as each of the first and second gate electrodes 126 and 128, the first to fourth contact holes 132, 134, 136 and 138 are formed only through the interlayer insulating layer 130.

A first source electrode 142, a first drain electrode 144, a second source electrode 146 and a second drain electrode 148, which are formed of a conductive material, e.g., metal, are formed on the interlayer insulating layer 130. The first source electrode 142 and the first drain electrode 144 are spaced apart from each other with respect to the first gate electrode 126 and respectively contact both sides of the first semiconductor layer 120 through the first and second contact holes 132 and 134. The second source electrode 146 and the second drain electrode 148 are spaced apart from each other with respect to the second gate electrode 128 and respectively contact both sides of the second semiconductor layer 122 through the third and fourth contact holes 136 and 138.

The first semiconductor layer 120, the first gate electrode 126, the first source electrode 142 and the first drain electrode 144 constitute the first driving element Td1, and the second semiconductor layer 122, the second gate electrode 128, the second source electrode 146 and the second drain electrode 148 constitute the second driving element Td2. Each of the first and second driving elements Td1 and Td2 may be a thin film transistor (TFT).

In FIG. 5, the first gate electrode 126, the first source electrode 142, and the first drain electrode 144 are positioned over the first semiconductor layer 120, and the second gate electrode 128, the second source electrode 146, and the second drain electrode 148 are positioned over the second semiconductor layer 122. Namely, each of the first and second driving elements Td1 and Td2 has a coplanar structure.

Alternatively, in the first and second driving elements Td1 and Td2, the gate electrode may be positioned under the semiconductor layer, and the source and drain electrodes may be positioned over the semiconductor layer such that each of the first and second driving elements Td1 and Td2 may have an inverted staggered structure. In this instance, the semiconductor layer may include amorphous silicon.

In addition, the low potential voltage line Vss, the first data line DL1, the first high potential voltage line Vdd1, the second data line DL2 and the second high potential voltage line Vdd2 are formed on the interlayer insulating layer 130. Each of the low potential voltage line Vss, the first data line DL1, the first high potential voltage line Vdd1, the second data line DL2 and the second high potential voltage line Vdd2 may be formed of the same material as the source electrode 140.

The first high potential voltage line Vdd1 is connected to the first source electrode 142. For example, the first source electrode 142 may extend from the first high potential voltage line Vdd1. The second high potential voltage line Vdd2 is connected to the second source electrode 146. For example, the second source electrode 146 may extend from the second high potential voltage line Vdd2.

The first switching element Ts1, which is connected to the gate line GL and the first data line DL1, and the second switching element Ts2, which is connected to the gate line GL and second data line DL2, may be further formed in each pixel region P. Each of the first and second switching elements Ts1 and Ts2 may be a TFT. The first switching element Ts1 is connected to the first driving element Td1, and the second switching element Ts2 is connected to the second driving element Td2.

For example, the first switching element Ts1 may include a semiconductor layer, a gate electrode, a source electrode and a drain electrode. In the first switching element Ts1, the gate electrode is connected to the gate line GL, the source electrode is connected to the first data line DL1, and the drain electrode is connected to the first drain electrode 144 of the first driving element Td1.

The second switching element Ts2 may include a semiconductor layer, a gate electrode, a source electrode and a drain electrode. In the second switching element Ts2, the gate electrode is connected to the gate line GL, the source electrode is connected to the second data line DL2, and the drain electrode is connected to the second drain electrode 148 of the second driving element Td2.

In addition, in each pixel region P, the first storage capacitor Cst1 for maintaining a voltage of the first gate electrode 126 of the first driving element Td1 and the second storage capacitor Cst2 for maintaining a voltage of the second gate electrode 128 of the second driving element Td2 may be further disposed.

A planarization layer 150 is formed on the first and second source electrodes 142 and 146, the first and second drain electrodes 144 and 148, the low potential voltage line Vss, the first and second high potential voltage lines Vdd1 and Vdd2 and the first and second data lines DL1 and DL2 and over an entire surface of the first transparent substrate 110. The planarization layer 150 may provide a flat top surface and includes a first drain contact hole 152 exposing the first drain electrode 144 of the first driving element Td1.

The first electrode 210 is formed on the planarization layer 150 and in each pixel region P. The first electrodes 210 in each of the pixel regions P are separated from each other. The first electrode 210 is connected to the first drain electrode 144 of the first driving element Td1 through the first drain contact hole 152.

The first electrode 210 may be an anode and may be formed of a conductive material having a relatively high work function value. The first electrode 210 may include a transparent conductive oxide material layer formed of a transparent conductive oxide (TCO). For example, the transparent conductive oxide may be at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO). The first electrode 210 is a transparent electrode.

The first electrode 210 has an area smaller than the pixel region P. For example, the first electrode 210 may be positioned in a region defined by the gate line GL, the first data line DL1 and the first high potential voltage line Vdd1.

A bank layer 160 is formed on the planarization layer 150 to cover an edge of the first electrode 210. The bank layer 160 includes a first bank 162 having a first thickness and a second bank 164 having a second thickness greater than the first thickness. The second bank 164 is positioned on the first bank 162. For example, the first bank 162 may have a first height from the first transparent substrate 110, and the second bank 164 may have a second height, which is greater than the first height, from the first transparent substrate 110.

The bank layer 160 includes a first opening op1 corresponding to the first electrode 210 and a second opening op2 corresponding to the pixel region P. The second opening op2 has an area greater than the first opening op1. Namely, the first bank 162 has the first opening op1 exposing a center of the first electrode 210, and the second bank 164 has the second opening op2 corresponding to the pixel region P.

A common contact hole 166 exposing the low potential voltage line Vss and a second drain contact hole 168 exposing the second drain electrode 148 of the second driving element Td2 are formed through the bank layer 160 and the planarization layer 150.

A first organic light emitting layer 220 is formed on the first electrode 210. The first organic light emitting layer 220 may have a single-layered structure of a first emitting material layer (EML). Alternatively, the first organic light emitting layer 220 may further include at least one of a hole injection layer (HIL), a hole transporting layer (HTL), an electron blocking layer (EBL), a hole blocking layer (HBL), an electron transporting layer (ETL) and an electron injection layer (EIL) to have a multi-layered structure.

The first organic light emitting layer 220 may include two or more EMLs spaced part from each other. In this case, two or more EMLs may be the same color EML or different color EMLs.

At least a portion of the first organic light emitting layer 220 may be formed by a solution process. For example, the first organic light emitting layer 220 may be formed by an inkjet process or a spin-coating process. Alternatively, the first organic light emitting layer 220 may be formed by a deposition process. In FIG. 5, the first organic light emitting layer 220 may be formed by the solution process. In this case, the first organic light emitting layer 220 may be formed in the first opening op1, and a thickness of an edge of the first organic light emitting layer 220 may be greater than a thickness of a center of the first organic light emitting layer 220.

The second electrode 230 is formed on the first organic light emitting layer 220 and the bank layer 160 over the first transparent substrate 110. The second electrode 230 is connected to the low potential voltage line Vss through the common contact hole 166.

The second electrodes 230 in each of the pixel regions P may be separated from each other. Alternatively, the second electrode 230 in a first pixel region and the second electrode in a second pixel region, which is adjacent to the first pixel region with the low potential voltage line Vss therebetween, may be integrated as one-body.

The second electrode 230 in the first opening op1 is positioned on the first organic light emitting layer 220, and the second electrode 230 in the second opening op2 is positioned on the first bank 162. Namely, the second electrode 230 has an area greater than each of the first electrode 210 and the first organic light emitting layer 220. An area of the second electrode 230 may be same as that of the second opening op2.

The second may be a cathode and may be formed of a conductive material having a relatively low work function value. For example, the second electrode 230 may be formed of a material such as aluminum (Al), magnesium (Mg), calcium (Ca), silver (Ag), their alloy or their combination and may have high conductivity and high reflectance. Namely, the second electrode 230 is a reflective electrode.

The first OLED D1 is positioned on the planarization layer 150 and includes the first electrode 210, the first organic light emitting layer 220 on the first electrode 210 and the second electrode 230 on the first organic light emitting layer 220. The first OLED D1 may be positioned in each of red, green and blue pixel regions and may provide red, green and blue light, respectively. Alternatively, the first OLED D1 may provide white light.

A second organic light emitting layer 240 is formed on the second electrode 230. The second organic light emitting layer 240 may have substantially the same area as the second electrode 230.

The first organic light emitting layer 220 may provide a light having a first wavelength range, and the second organic light emitting layer 240 may provide a light having a second wavelength range. The first and second wavelength ranges may be same or different. For example, each of the light having the first wavelength range and the light having the second wavelength range may be one of red, green and blue light.

The second organic light emitting layer 240 may have a single-layered structure of a second EML. Alternatively, the second organic light emitting layer 240 may further include at least one of an HIL, an HTL, an EBL, an HBL, an ETL and an EIL to have a multi-layered structure.

The second organic light emitting layer 240 may include two or more EMLs spaced part from each other. In this case, two or more EMLs may be the same color EML or different color EMLs.

At least a portion of the second organic light emitting layer 240 may be formed by a solution process. For example, the second organic light emitting layer 240 may be formed by an inkjet process or a spin-coating process. Alternatively, the second organic light emitting layer 240 may be formed by a deposition process. In FIG. 5, the second organic light emitting layer 240 may be formed by the solution process. In this case, the second organic light emitting layer 240 may be formed in the second opening op2, and a thickness of an edge of the second organic light emitting layer 240 may be greater than a thickness of a center of the second organic light emitting layer 240.

The first organic light emitting layer 220 is positioned in a region surrounded by the first bank 162, and each of the second electrode 230 and the second organic light emitting layer 240 is positioned in a region surrounded by the second bank 164.

In an embodiment of the present disclosure, the first organic light emitting layer 220 may be formed by a solution process, and the second organic light emitting layer 240 may be formed by a deposition process.

The third electrode 250 is formed on the second organic light emitting layer 240.

The third electrodes 250 in each of the pixel regions P are separated from each other. The third electrode 250 is connected to the second drain electrode 148 of the second driving element Td2 through the second drain electrode 148.

The third electrode 250 may be an anode and may be formed of a conductive material having a relatively high work function value. The third electrode 250 may include a transparent conductive oxide material layer formed of a transparent conductive oxide (TCO). For example, the transparent conductive oxide may be at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO). The third electrode 250 is a transparent electrode.

The third electrode 250 has an area greater than each of the second electrode 230 and the second organic light emitting layer 240. The third electrode 250 has an area greater than the second opening op2 and may cover a portion of an upper surface of the second bank 164.

The second OLED D2 includes the second electrode 230, the second organic light emitting layer 240 on the second electrode 230 and the third electrode 250 on the second organic light emitting layer 240. The second OLED D2 may be positioned in each of red, green and blue pixel regions and may provide red, green and blue light, respectively. Alternatively, the second OLED D2 may provide white light.

The second OLED D2 has an area greater than the first OLED D1 and may overlap the first and second driving elements Td1 and Td2. Accordingly, an aperture ratio of the second OLED D2 is not decreased by the first and second driving elements Td1 and Td2.

In other words, the first pixel driving circuit part PDC1 including the first driving element Td1 and the second pixel driving circuit part PDC2 including the second driving element Td2 is disposed in the first region of the pixel region P and over the first transparent substrate 110, and the first OLED D1 is disposed in the second region of the pixel region P and over the first transparent substrate 110, e.g., over the first and second pixel driving circuit parts PDC1 and PDC2. In addition, the second OLED D2 is disposed in the first and second regions of the pixel region P and on the first OLED D1.

Figure 6:
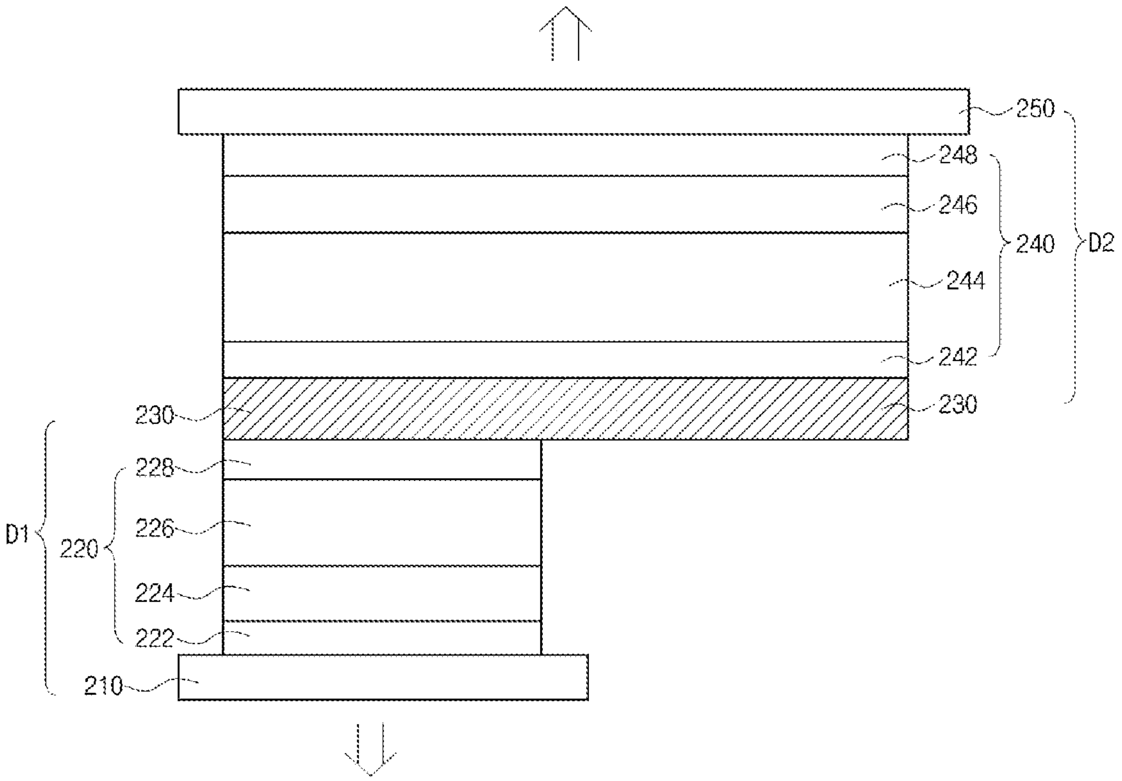
FIG. 6 is a schematic cross-sectional view of an OLED, according to some embodiments of the present disclosure.

Referring to FIG. 6, which is a cross-sectional view of an OLED, the OLED in the dual-side organic light emitting display device of the present disclosure includes the first and second OLEDs D1 and D2 sharing the second electrode 230 and sequentially stacked.

The first OLED D1 includes the first electrode 210, e.g., a lower electrode or a first anode, the second electrode, e.g., a middle electrode or a cathode, facing the first electrode 210 and the first organic light emitting layer 220 between the first and second electrodes 210 and 230. The hole from the first electrode 210 and the electron from the second electrode 230 are combined in the first organic light emitting layer 220, and the light is emitted from the first organic light emitting layer 220.

The first organic light emitting layer 220 includes a first EML 226 between the first and second electrode 210 and 230.

In addition, the first organic light emitting layer 220 may further include a first HTL 224 between the first electrode 210 and the first EML 226 and a first ETL 228 between the first EML 226 and the second electrode 230.

Moreover, the first organic light emitting layer 220 may further include a first HIL 222 between the first electrode 210 and the first HTL 224.

Namely, the first OLED D1 may have a structure of the first electrode 210 (e.g., a first anode), the HIL 222, the first HTL 224, the first EML 226, the first ETL 228 and the second electrode 230 sequentially stacked. The first OLED D1 may be a normal-structure OLED.

The second OLED D2 includes the second electrode 230, the third electrode 250 (e.g., a second anode) and a second organic light emitting layer 240 between the second and third electrodes 230 and 250. The electron from the second electrode 230 and the hole from the third electrode 250 are combined in the second organic light emitting layer 240, and the light is emitted from the second organic light emitting layer 240.

The second organic light emitting layer 240 includes a second EML 244 between the second and third electrodes 230 and 250.

In addition, the second organic light emitting layer 240 may further include the second ETL 242 between the second electrode 230 and the second EML 244 and the second HTL 246 between the second EML 244 and the third electrode 250.

Moreover, the second organic light emitting layer 240 may further include a second HIL 248 between the third electrode 250 and the second HTL 246.

Namely, the second OLED D2 may have a structure of the second electrode 230 as a cathode, the second ETL 242, the second EML 244, the second HTL 246, the second HIL 248 and the third electrode 250 sequentially stacked. The second OLED D2 may be an inverted-structure OLED.

Referring to FIG. 5, the protection layer 170 is formed on the third electrode 250. For example, the protection layer 170 may be formed of an inorganic insulating material.

The seal layer 180 is formed on the protection layer 170. The seal layer 180 may be formed of an organic insulating material.

The penetration of moisture into the first and second OLEDs D1 and D2 can be prevented or at least reduced by the protection layer 170 and the seal layer 180.

The second transparent substrate 190 is disposed on the seal layer 180. For example, the seal layer 180 may have an adhesive property so that the second transparent substrate 190 may be attached to the protection layer 170 by the seal layer 180.

The dual-side organic light emitting display device 100 may further include a color filter layer corresponding to the red, green and blue pixel regions. The color filter layer may include a red color filter, a green color filter and a blue color filter respectively corresponding to the red, green and blue pixel regions. When the dual-side organic light emitting display device 100 includes the color filter layer, the color purity of the dual-side organic light emitting display device 100 can be improved. In addition, when each of the first and second OLEDs D1 and D2 is a white OLED, a full color image can be provided by the color filter layer.

For example, a first color filter layer may be disposed between the first transparent substrate 110 and the first OLED D1, and a second color filter layer may be disposed between the second OLED D2 and the second transparent substrate 190.

The dual-side organic light emitting display device 100 may further include a polarization plate for reducing an ambient light. The polarization plate may be a circular polarization plate. For example, a first polarization plate may be disposed at an outer side of the first transparent substrate 110, and a second polarization plate may be disposed at an outer side of the second transparent substrate 190.

As described above, in the dual-side organic light emitting display device 100, the first and second OLEDs D1 and D2 share the second electrode 230 as a cathode and are independently driven. A first image is displayed at a side of the first electrode 210 of the first OLED D1, and a second image is displayed at a side of the third electrode 250 of the second OLED D2.

In addition, the second OLED D2 has a relatively large aperture ratio so that the energy efficiency and the lifespan of the second OLED D2 can be improved.

Moreover, since the second electrode 230 as a cathode can be formed of a conductive material, e.g., metal, having high conductivity and high reflectance, the emitting efficiency, e.g., brightness, of the dual-side organic light emitting display device 100 can be improved.

Figure 7:
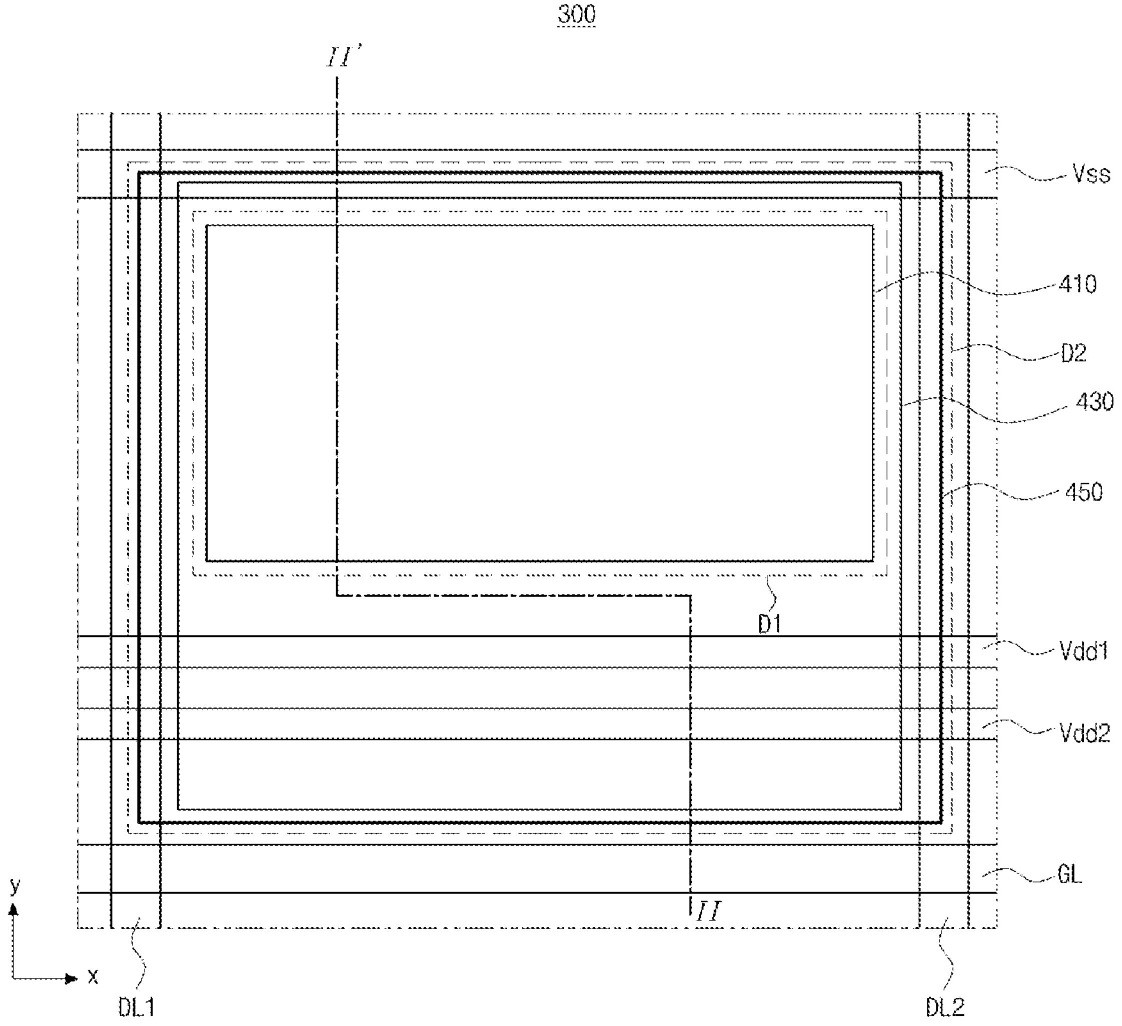
FIG. 7 is a schematic plane view showing a structure of a pixel region of a dual-side organic light emitting display device according to the second embodiment of the present disclosure.

FIG. 7 is a schematic plane view showing a structure of a pixel region of a dual-side organic light emitting display device according to the second embodiment of the present disclosure.

As shown in FIG. 7, the dual-side organic light emitting display device 300 includes the gate line GL, the low potential voltage line Vss, the first high potential voltage line Vdd1, the second high potential voltage line Vdd2, the first data line DL1, the second data line DL2, the first driving element Td1 (of FIG. 1), the second driving element Td2 (of FIG. 1), the first OLED D1 and the second OLED D2.

Each of the gate line GL, the low potential voltage line Vss, the first high potential voltage line Vdd1 and the second high potential voltage line Vdd2 extends along the first direction x, and each of the first data line DL1 and the second data line DL2 extends along the second direction y. For example, the second direction y may be perpendicular to the first direction x.

The first driving element Td1 is connected to the first high potential voltage line Vdd1, and the second driving element Td2 is connected to the second high potential voltage line Vdd2.

The first OLED D1 is connected to the first driving element Td1 and the low potential voltage line Vss, and the second OLED D2 is connected to the second driving element Td and the low potential voltage line Vss.

In addition, the dual-side organic light emitting display device 100 may further include the first switching element Ts1 (of FIG. 1), which is connected to the gate line GL, the first data line DL1 and the first driving element Td1, and the second switching element Ts2 (of FIG. 1), which is connected to the gate line GL, the second data line DL2 and the second driving element Td2.

The gate line GL, the second high potential voltage line Vdd2, the first high potential voltage line Vdd1 and low potential voltage line Vss may be sequentially arranged along the second direction y to be spaced apart from each other. The first data line DL1 and the second data line DL2 may be sequentially arranged along the first direction x to be spaced apart from each other.

The first and second data lines DL1 and DL2 cross with the gate line GL to define the pixel region P, and the first and second switching elements Ts1 and Ts2, the first and second driving elements Td1 and Td2 and the first and second OLEDs D1 and D2 are disposed in each pixel region P.

The first OLED D1 includes a first electrode 210 as an anode, a first organic light emitting layer and a second electrode 230 as a cathode, and the second OLED D2 includes a second electrode 230 as a cathode, a second organic light emitting layer and a third electrode 250 as an anode. Namely, the second OLED D2 shares the second electrode 230 of the first OLED D1 and is disposed on the first OLED D1.

The first and second OLEDs D1 and D2 share the second electrode 230 as the cathode. The first OLED D1 is driven by the first driving element Td1, and the second OLED D2 is driven by the second driving element Td2. Namely, the first and second OLEDs D1 and D2 are independently driven.

The first OLED D1 is positioned in a region surrounded by the first data line DL1, the second data line DL2, the low potential voltage line Vss and the first high potential voltage line Vdd1, and the second OLED D2 has a plan area greater than the first OLED D1. For example, one end of the second OLED D2 may overlap the low potential voltage line Vss, and the other end of the second OLED D2 may be beyond the second high potential voltage line Vdd2. For example, the other end of the second OLED D2 may overlap the gate line GL.

Namely, the first OLED D1 may not overlap the gate line GL, the first and second data lines DL1 and DL2, the low potential voltage line Vss and the first and second high potential voltage lines Vdd1 and Vdd2, and the second OLED D2 may overlap the gate line GL, the first and second data lines DL1 and DL2, the low potential voltage line Vss and the first and second high potential voltage lines Vdd1 and Vdd2.

The first OLED D1 emits light along a first normal line direction with respect to the first and second directions x and y, and the second OLED D2 emits light along a second normal line direction opposite to the first normal line direction.

Accordingly, the dual-side organic light emitting display device 100 of the present disclosure can provide a dual-side image display. Namely, in the dual-side organic light emitting display device 100 of the present disclosure, a first image can be displayed at a side in the first normal line direction, and a second image can be displayed at a side in the second normal line direction.

Figure 8:
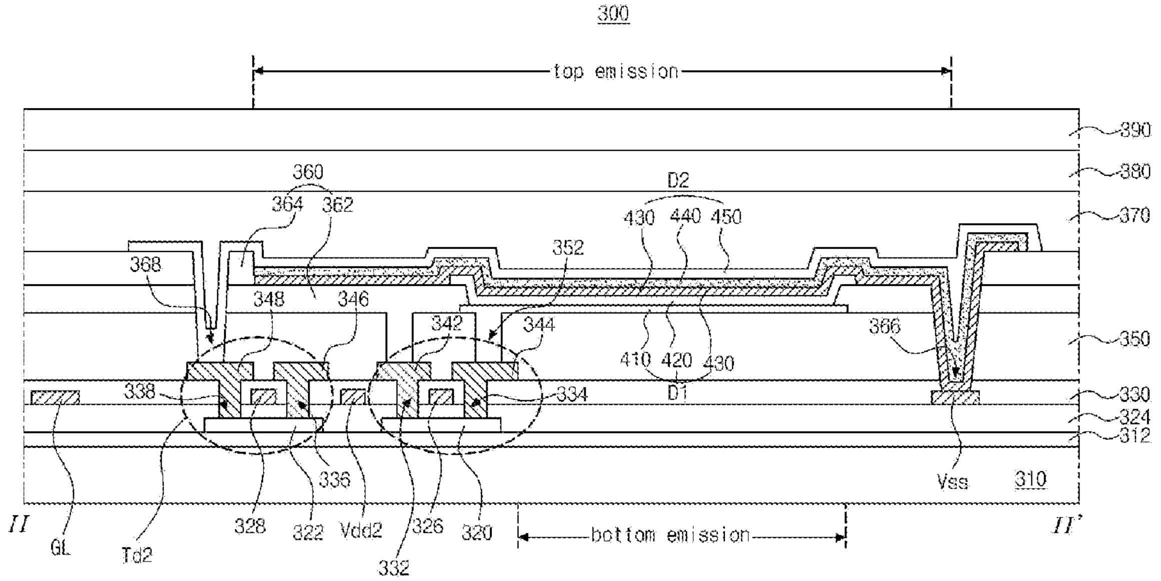
FIG. 8 is a cross-sectional view taken along the line II-II' in FIG. 7 according to the second embodiment of the present disclosure.

FIG. 8 is a cross-sectional view taken along the line II-II' in FIG. 7.

As shown in FIG. 8, the first and second driving elements Td1 and Td2 and the first and second OLEDs D1 and D2 are formed on a first transparent substrate 310 including a pixel region.

In addition, a protection layer 370 covering the second OLED D2, a seal layer 380 on the protection layer 370 and a second transparent substrate 390 may be disposed on the second OLED D2.

Each of the first and second transparent substrates 310 and 390 may be a glass substrate or a flexible substrate. For example, the flexible substrate may be one of a polyimide (PI) substrate, a polyethersulfone (PES) substrate, a polyethylenenaphthalate (PEN) substrate, a polyethylene Terephthalate (PET) substrate and a polycarbonate (PC) substrate.

A buffer layer 312 is formed on the first transparent substrate 310, and the first and second driving elements Td1 and Td2 are formed on the buffer layer 312. For example, the buffer layer 312 may be formed of an inorganic insulating material, e.g., silicon oxide or silicon nitride. The buffer layer 312 may be omitted. In this case, the first and second driving elements Td1 and Td2 can be formed on the first transparent substrate 310.

A first semiconductor layer 320 and a second semiconductor layer 322 are formed on the buffer layer 312. Each of the first and second semiconductor layers 320 and 322 may include an oxide semiconductor material. When the first and second semiconductor layers 320 and 322 include the oxide semiconductor material, a light-shielding pattern (not shown) may be formed under the first and second semiconductor layers 320 and 322. The light to the first and second semiconductor layers 320 and 322 can be shielded or blocked by the light-shielding pattern such that thermal degradation of the first and second semiconductor layers 320 and 322 can be prevented or at least reduced.

Alternatively, each of the first and second semiconductor layers 320 and 322 may include polycrystalline silicon. In this case, impurities may be doped into both sides of each of the first and second semiconductor layers 320 and 322.

A gate insulating layer 324 is formed on the first and second semiconductor layers 320 and 322 and over an entire surface of the first transparent substrate 310. The gate insulating layer 324 may be formed of an inorganic insulating material such as silicon oxide (SiOx) or silicon nitride (SiNx).

A first gate electrode 326 and a second gate electrode 328, each of which is formed of a conductive material, e.g., metal, is formed on the gate insulating layer 324. The first and second gate electrodes 326 and 328 correspond to a center of the first and second semiconductor layers 320 and 322, respectively.

In addition, the gate line GL, the low potential voltage line Vss and the first and second high potential voltage lines Vdd1 and Vdd2 are formed on the gate insulating layer 324. For example, the first and second high potential voltage lines Vdd1 and Vdd2 may be positioned between the first gate electrode 326 and the second gate electrode 328.

Each of the first and second gate electrodes 326 and 328, the gate line GL, the low potential voltage line Vss and the first and second high potential voltage lines Vdd1 and Vdd2 may be formed of the same material.

In FIG. 8, the gate insulating layer 324 is formed on an entire surface of the first transparent substrate 310. Alternatively, the gate insulating layer 324 may be patterned to have the same shape as each of the first and second gate electrode 326 and 328.

An interlayer insulating layer 330, which is formed of an insulating material, is formed on the first and second gate electrodes 326 and 328, the gate line GL, the low potential voltage line Vss and the first and second high potential voltage lines Vdd1 and Vdd2 and over an entire surface of the first transparent substrate 310. The interlayer insulating layer 330 may be formed of an inorganic insulating material, e.g., silicon oxide or silicon nitride, or an organic insulating material, e.g., benzocyclobutene or photo-acryl.

The interlayer insulating layer 330 includes first and second contact holes 332 and 334 exposing both sides of the first semiconductor layer 320 and third and fourth contact holes 336 and 338 exposing both sides of the second semiconductor layer 322. The first and second contact holes 332 and 334 are positioned at both sides of the first gate electrode 326 to be spaced apart from the first gate electrode 326, and the third and fourth contact holes 336 and 338 are positioned at both sides of the second gate electrode 328 to be spaced apart from the second gate electrode 328.

In FIG. 8, the first to fourth contact holes 332, 334, 336 and 338 are formed through the interlayer insulating layer 330 and the gate insulating layer 324. Alternatively, when the gate insulating layer 324 is patterned to have the same shape as each of the first and second gate electrodes 326 and 328, the first to fourth contact holes 332, 334, 336 and 338 are formed only through the interlayer insulating layer 330.

A first source electrode 342, a first drain electrode 344, a second source electrode 346 and a second drain electrode 348, which are formed of a conductive material, e.g., metal, are formed on the interlayer insulating layer 330. The first source electrode 342 and the first drain electrode 344 are spaced apart from each other with respect to the first gate electrode 326 and respectively contact both sides of the first semiconductor layer 320 through the first and second contact holes 332 and 334. The second source electrode 346 and the second drain electrode 348 are spaced apart from each other with respect to the second gate electrode 328 and respectively contact both sides of the second semiconductor layer 322 through the third and fourth contact holes 336 and 338.

The first semiconductor layer 320, the first gate electrode 326, the first source electrode 342 and the first drain electrode 344 constitute the first driving element Td1, and the second semiconductor layer 322, the second gate electrode 328, the second source electrode 346 and the second drain electrode 348 constitute the second driving element Td2. Each of the first and second driving elements Td1 and Td2 may be a thin film transistor (TFT).

In FIG. 8, the first gate electrode 326, the first source electrode 342, and the first drain electrode 344 are positioned over the first semiconductor layer 320, and the second gate electrode 328, the second source electrode 346, and the second drain electrode 348 are positioned over the second semiconductor layer 322. Namely, each of the first and second driving elements Td1 and Td2 has a coplanar structure.

Alternatively, in the first and second driving elements Td1 and Td2, the gate electrode may be positioned under the semiconductor layer, and the source and drain electrodes may be positioned over the semiconductor layer such that each of the first and second driving elements Td1 and Td2 may have an inverted staggered structure. In this instance, the semiconductor layer may include amorphous silicon.

In addition, the first data line DL1 and the second data line DL2 are formed on the interlayer insulating layer 330. Each of the first data line DL1 and the second data line DL2 may be formed of the same material as the source electrode 340.

The first high potential voltage line Vdd1 is connected to the first source electrode 342. For example, a first contact hole exposing the first high potential voltage line Vdd1 may be formed through the interlayer insulating layer 330, and the first source electrode 342 may be connected to the first high potential voltage line Vdd1 through the first contact hole. The second high potential voltage line Vdd2 is connected to the second source electrode 346. For example, a second contact hole exposing the second high potential voltage line Vdd2 may be formed through the interlayer insulating layer 330, and the second source electrode 342 may be connected to the second high potential voltage line Vdd2 through the second contact hole.

The first switching element Ts1, which is connected to the gate line GL and the first data line DL1, and the second switching element Ts2, which is connected to the gate line GL and second data line DL2, may be further formed in each pixel region P. Each of the first and second switching elements Ts1 and Ts2 may be a TFT. The first switching element Ts1 is connected to the first driving element Td1, and the second switching element Ts2 is connected to the second driving element Td2.

For example, the first switching element Ts1 may include a semiconductor layer, a gate electrode, a source electrode and a drain electrode. In the first switching element Ts1, the gate electrode is connected to the gate line GL, the source electrode is connected to the first data line DL1, and the drain electrode is connected to the first drain electrode 344 of the first driving element Td1.

The second switching element Ts2 may include a semiconductor layer, a gate electrode, a source electrode and a drain electrode. In the second switching element Ts2, the gate electrode is connected to the gate line GL, the source electrode is connected to the second data line DL2, and the drain electrode is connected to the second drain electrode 348 of the second driving element Td2.

In addition, in each pixel region P, the first storage capacitor Cst1 for maintaining a voltage of the first gate electrode 326 of the first driving element Td1 and the second storage capacitor Cst2 for maintaining a voltage of the second gate electrode 328 of the second driving element Td2 may be further disposed.

A planarization layer 350 is formed on the first and second source electrodes 342 and 346, the first and second drain electrodes 344 and 348 and the first and second data lines DL1 and DL2 and over an entire surface of the first transparent substrate 310. The planarization layer 350 may provide a flat top surface and includes a first drain contact hole 352 exposing the first drain electrode 344 of the first driving element Td1.

The first electrode 410 is formed on the planarization layer 350 and in each pixel region P. The first electrodes 410 in each of the pixel regions P are separated from each other. The first electrode 410 is connected to the first drain electrode 344 of the first driving element Td1 through the first drain contact hole 352.

The first electrode 410 may be an anode and may be formed of a conductive material having a relatively high work function value. The first electrode 410 may include a transparent conductive oxide material layer formed of a transparent conductive oxide (TCO). For example, the transparent conductive oxide may be at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO). The first electrode 410 is a transparent electrode.

The first electrode 410 has an area smaller than the pixel region P. For example, the first electrode 410 may be positioned in a region defined by the first data line DL1, the second data line DL2, the low potential voltage line Vss and the first high potential voltage line Vdd1.

A bank layer 360 is formed on the planarization layer 350 to cover an edge of the first electrode 410. The bank layer 360 includes a first bank 362 having a first thickness and a second bank 364 having a second thickness greater than the first thickness. For example, the first bank 362 may have a first height from the first transparent substrate 310, and the second bank 364 may have a second height, which is greater than the first height, from the first transparent substrate 310.

The bank layer 360 includes a first opening op1 corresponding to the first electrode 410 and a second opening op2 corresponding to the pixel region P. The second opening op2 has an area greater than the first opening op1. Namely, the first bank 362 has the first opening opt exposing a center of the first electrode 410, and the second bank 364 has the second opening op2 corresponding to the pixel region P.

A common contact hole 366 exposing the low potential voltage line Vss and a second drain contact hole 368 exposing the second drain electrode 348 of the second driving element Td2 are formed through the bank layer 360, the planarization layer 350 and the interlayer insulating layer 330.

A first organic light emitting layer 420 is formed on the first electrode 410. The first organic light emitting layer 420 may have a single-layered structure of a first emitting material layer (EML). Alternatively, the first organic light emitting layer 420 may further include at least one of an HIL, an HTL, an EBL, an HBL, an ETL and an EIL to have a multi-layered structure.

The first organic light emitting layer 420 may include two or more EMLs spaced part from each other. In this case, two or more EMLs may be the same color EML or different color EMLs.

At least a portion of the first organic light emitting layer 420 may be formed by a solution process. For example, the first organic light emitting layer 420 may be formed by an inkjet process or a spin-coating process. Alternatively, the first organic light emitting layer 420 may be formed by a deposition process. In FIG. 8, the first organic light emitting layer 420 may be formed by the deposition process, and an edge of the first organic light emitting layer 420 covers a portion of an upper surface of the first bank 362.

The second electrode 430 is formed on the first organic light emitting layer 420 and the bank layer 360 over the first transparent substrate 310. The second electrode 430 is connected to the low potential voltage line Vss through the common contact hole 366.

The second electrodes 430 in each of the pixel regions P may be separated from each other. Alternatively, the second electrode 430 in a first pixel region and the second electrode in a second pixel region, which is adjacent to the first pixel region with the low potential voltage line Vss therebetween, may be integrated as one-body.

The second electrode 430 in the first opening op1 is positioned on the first organic light emitting layer 420, and the second electrode 430 in the second opening op2 is positioned on the first bank 362. Namely, the second electrode 430 has an area greater than each of the first electrode 410 and the first organic light emitting layer 420. An area of the second electrode 430 may be same as that of the second opening op2.

The second electrode 430 may be a cathode and may be formed of a conductive material having a relatively low work function value. For example, the second electrode 430 may be formed of a material such as aluminum (Al), magnesium (Mg), calcium (Ca), silver (Ag), their alloy or their combination and may have high conductivity and high reflectance. Namely, the second electrode 430 is a reflective electrode.

The first OLED D1 is positioned on the planarization layer 350 and includes the first electrode 410, the first organic light emitting layer 420 on the first electrode 410 and the second electrode 430 on the first organic light emitting layer 420. The first OLED D1 may be positioned in each of red, green and blue pixel regions and may provide red, green and blue light, respectively. Alternatively, the first OLED D1 may provide white light.

A second organic light emitting layer 440 is formed on the second electrode 430. The second organic light emitting layer 440 may have substantially the same area as the second electrode 430. An edge of the second electrode 430 may be covered with the second organic light emitting layer 440.

The first organic light emitting layer 420 may provide a light having a first wavelength range, and the second organic light emitting layer 440 may provide a light having a second wavelength range. The first and second wavelength ranges may be same or different. For example, each of the light having the first wavelength range and the light having the second wavelength range may be one of red, green and blue light.

The second organic light emitting layer 440 may have a single-layered structure of a second EML. Alternatively, the second organic light emitting layer 440 may further include at least one of an HIL, an HTL, an EBL, an HBL, an ETL and an EIL to have a multi-layered structure.

The second organic light emitting layer 440 may include two or more EMLs spaced part from each other. In this case, two or more EMLs may be the same color EML or different color EMLs.

At least a portion of the second organic light emitting layer 440 may be formed by a solution process. For example, the second organic light emitting layer 440 may be formed by an inkjet process or a spin-coating process. Alternatively, the second organic light emitting layer 440 may be formed by a deposition process. In FIG. 8, the second organic light emitting layer 440 may be formed by the deposition process, and an edge of the second organic light emitting layer 440 covers an edge of the second electrode 430 on the second bank 364.

The third electrode 450 is formed on the second organic light emitting layer 440.

The third electrodes 450 in each of the pixel regions P are separated from each other. The third electrode 450 is connected to the second drain electrode 348 of the second driving element Td2 through the second drain electrode 348.

The third electrode 450 may be an anode and may be formed of a conductive material having a relatively high work function value. The third electrode 450 may include a transparent conductive oxide material layer formed of a transparent conductive oxide (TCO). For example, the transparent conductive oxide may be at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc-oxide (Al:ZnO, AZO). The third electrode 450 is a transparent electrode.

The third electrode 450 has an area greater than each of the second electrode 430 and the second organic light emitting layer 440. The third electrode 450 has an area greater than the second opening op2 and may cover a portion of an upper surface of the second bank 364.

The second OLED D2 includes the second electrode 430, the second organic light emitting layer 440 on the second electrode 430 and the third electrode 450 on the second organic light emitting layer 440. The second OLED D2 may be positioned in each of red, green and blue pixel regions and may provide red, green and blue light, respectively. Alternatively, the second OLED D2 may provide white light.

The second OLED D2 has an area greater than the first OLED D1 and may overlap the first and second driving elements Td1 and Td2. Accordingly, an aperture ratio of the second OLED D2 is not decreased by the first and second driving elements Td1 and Td2.

In other words, the first pixel driving circuit part PDC1 including the first driving element Td1 and the second pixel driving circuit part PDC2 including the second driving element Td2 is disposed in the first region of the pixel region P and over the first transparent substrate 310, and the first OLED D1 is disposed in the second region of the pixel region P and over the first transparent substrate 310, e.g., over the first and second pixel driving circuit parts PDC1 and PDC2. In addition, the second OLED D2 is disposed in the first and second regions of the pixel region P and on the first OLED D1.

Referring to FIG. 6, the first organic light emitting layer 420 of the first OLED D1 may have a structure of the HIL 222, the first HTL 224, the first EML 226 and the first ETL 228 sequentially stacked, and the second organic light emitting layer 440 of the second OLED D2 may have a structure of the second ETL 242, the second EML 244, the second HTL 246 and the second HIL 248 sequentially stacked.

Referring to FIG. 8, the protection layer 370 is formed on the third electrode 450. For example, the protection layer 370 may be formed of an inorganic insulating material.

The seal layer 380 is formed on the protection layer 370. The seal layer 380 may be formed of an organic insulating material.

The penetration of moisture into the first and second OLEDs D1 and D2 can be prevented or at least reduced by the protection layer 370 and the seal layer 380.

The second transparent substrate 390 is disposed on the seal layer 380. For example, the seal layer 380 may have an adhesive property so that the second transparent substrate 390 may be attached to the protection layer 370 by the seal layer 380.

The dual-side organic light emitting display device 300 may further include a color filter layer corresponding to the red, green and blue pixel regions. The color filter layer may include a red color filter, a green color filter and a blue color filter respectively corresponding to the red, green and blue pixel regions. When the dual-side organic light emitting display device 300 includes the color filter layer, the color purity of the dual-side organic light emitting display device 300 can be improved. In addition, when each of the first and second OLEDs D1 and D2 is a white OLED, a full color image can be provided by the color filter layer.

For example, a first color filter layer may be disposed between the first transparent substrate 310 and the first OLED D1, and a second color filter layer may be disposed between the second OLED D2 and the second transparent substrate 390.

The dual-side organic light emitting display device 300 may further include a polarization plate for reducing an ambient light. The polarization plate may be a circular polarization plate. For example, a first polarization plate may be disposed at an outer side of the first transparent substrate 310, and a second polarization plate may be disposed at an outer side of the second transparent substrate 390.

As described above, in the dual-side organic light emitting display device 300, the first and second OLEDs D1 and D2 share the second electrode 430 as a cathode and are independently driven. A first image is displayed at a side of the first electrode 410 of the first OLED D1, and a second image is displayed at a side of the third electrode 450 of the second OLED D2.

In addition, the second OLED D2 has a relatively large aperture ratio so that the energy efficiency and the lifespan of the second OLED D2 can be improved.

Moreover, since the second electrode 430 as a cathode can be formed of a conductive material, e.g., metal, having high conductivity and high reflectance, the emitting efficiency, e.g., brightness, of the dual-side organic light emitting display device 300 can be improved.

It will be apparent to those skilled in the art that various modifications and variations can be made in the embodiments of the present disclosure without departing from the spirit or scope of the present disclosure. Thus, it is intended that the modifications and variations cover this disclosure provided they come within the scope of the appended claims and their equivalents.

What is claimed is:

1. A dual-side organic light emitting display device, comprising:

a first transparent substrate including a pixel region, the pixel region including a first region and a second region;

a first driving element and a second driving element positioned in the first region and over the first transparent substrate;

a first organic light emitting diode positioned in the second region and over the first and second driving elements, the first organic light emitting diode including a first electrode connected to the first driving element, a second electrode disposed over the first electrode and facing the first electrode, and a first organic light emitting layer between the first and second electrodes, wherein the second electrode is a cathode for the first organic light emitting diode; and a second organic light emitting diode positioned in the first and second regions and on the first organic light emitting diode, the second organic light emitting diode including a third electrode disposed over the second electrode and facing the second electrode, and connected to the second driving element and a second organic light emitting layer between the second and third electrodes, wherein the second electrode is a cathode for the second organic light emitting diode, and wherein the second electrode is positioned between the first transparent substrate and the third electrode, wherein a first light from the first organic light emitting diode is emitted toward a first direction through the first electrode, and a second light from the second organic light emitting diode is emitted toward a second direction through the third electrode, and wherein the second direction is opposite to the first direction.

2. The dual-side organic light emitting display device according to claim 1, further comprising:

a gate line extending along a third direction; and a first data line and a second data line extending along a fourth direction crossing the third direction.

3. The dual-side organic light emitting display device according to claim 2, wherein each of the first and second driving elements is positioned at the third direction or the fourth direction from the first organic light emitting diode.

4. The dual-side organic light emitting display device according to claim 2, further comprising:

a low potential voltage line connected to the second electrode;

a first high potential voltage line connected to the first driving element; and a second high potential voltage line connected to the second driving element.

5. The dual-side organic light emitting display device according to claim 4, wherein each of the low potential voltage line and the first and second high potential voltage lines extends along the third direction or the fourth direction.

6. The dual-side organic light emitting display device according to claim 5, wherein the first organic light emitting diode is positioned in a space between the first data line and the first high potential voltage line.

7. The dual-side organic light emitting display device according to claim 6, wherein the first organic light emitting diode is positioned in a space between the first data line and the first high potential voltage line.

8. The dual-side organic light emitting display device according to claim 5, wherein the second organic light emitting diode extends in an area greater than the first organic light emitting diode, and the second organic light emitting diode overlaps the low potential voltage line and the first and second high potential voltage lines.

9. The dual-side organic light emitting display device according to claim 1, wherein each of the first and third electrodes is a transparent electrode, and the second electrode is a reflective electrode.

10. The dual-side organic light emitting display device according to claim 1, wherein the first organic light emitting diode has a normal structure, and the second organic light emitting diode has an inverted structure.

11. The dual-side organic light emitting display device according to claim 1, wherein the first organic light emitting layer includes a first emitting material layer, a first hole transporting layer between the first electrode and the first emitting material layer and a first electron transporting layer between the first emitting material layer and the second electrode, and wherein the second organic light emitting layer includes a second emitting material layer, a second electron transporting layer between the second electrode and the second emitting material layer and a second hole transporting layer between the second emitting material layer and the third electrode.

12. The dual-side organic light emitting display device according to claim 1, wherein the first light has a first wavelength range, and the second light has a second wavelength range, and the first and second wavelength ranges are same.

13. The dual-side organic light emitting display device according to claim 1, wherein the first light has a first wavelength range, and the second light has a second wavelength range, and the first and second wavelength ranges are different.

14. The dual-side organic light emitting display device according to claim 1, further comprising:

a bank layer covering an edge of the first electrode, wherein the second electrode in the first region is disposed on the bank layer, and the second electrode in the second region is disposed on the first organic light emitting layer.

15. The dual-side organic light emitting display device according to claim 1, further comprising:

a protection layer on the third electrode;

a seal layer on the protection layer; and a second transparent substrate on the seal layer.

16. A dual-side organic light emitting display device, comprising:

a substrate having a first region and a second region;

at least one driving element in the first region;

an insulating layer on the at least one driving element;

an organic light emitting diode (OLED) stack, the OLED stack comprising:

a first electrode on the insulating layer;

a first organic light emitting layer on the first electrode in the second region;

a second electrode on the first organic light emitting layer and contacting the first organic light emitting layer;

a second organic light emitting layer on the second electrode in at least the first region and the second region, wherein the second organic light emitting layer contacts the second electrode; and a third electrode on the second organic light emitting layer, wherein the at least one driving element is configured to drive the OLED stack, the at least one driving element configured to drive the first organic light emitting layer to emit first light in a first direction, and the second organic light emitting layer to emit second light in a second direction opposite to the first direction.

17. The dual-side organic light emitting display device of claim 16, wherein the at least one driving element is disposed below the second organic light emitting layer.

18. The dual-side organic light emitting display device of claim 16, further comprising:

a gate line extending in a third direction different from the first direction and the second direction;

a data line extending in a fourth direction that intersects the third direction, wherein the at least one driving element comprises a first driving element configured to drive the first organic light emitting layer, and a second driving element configured to drive the second organic light emitting layer, and wherein the first driving element and the second driving element are arranged along the third direction or the fourth direction.

19. The dual-side organic light emitting display device of claim 16, wherein the at least one driving element comprises a first driving element configured to drive the first organic light emitting layer, and a second driving element configured to drive the second organic light emitting layer, and the dual-side organic light emitting display device further comprising:

a low potential voltage line connected to the second electrode;

a first high potential voltage line connected to the first driving element; and a second high potential voltage line connected to the second driving element, wherein at least one of the low potential voltage line, the first high potential voltage line, or the second high potential voltage line extends in a third direction or a fourth direction.

20. The dual-side organic light emitting display device of claim 19, wherein each of the low potential voltage line, the first high potential voltage line, or the second high potential voltage line is non-overlapping with the first organic light emitting layer in the first direction.

21. The dual-side organic light emitting display device of claim 20, wherein at least one of low potential voltage line, the first high potential voltage line, or the second high potential voltage line overlaps the second organic light emitting layer in the first direction.

22. The dual-side organic light emitting display device of claim 19, further comprising:

at least one data line extending in the fourth direction, wherein at least one of the low potential voltage line, the first high potential voltage line, and the second high potential voltage line also extends along the fourth direction.

23. The dual-side organic light emitting display device of claim 19, further comprising:

at least one gate line extending in the third direction, wherein at least one of the low potential voltage line, the first high potential voltage line, and the second high potential voltage line also extends along the third direction.

24. The dual-side organic light emitting display device of claim 6, wherein the first organic light emitting diode is positioned in a space surrounded by the first data line, the second data line, the low potential voltage line and the first high potential voltage line.

* * * * *